United States Patent [19]
Kakizaki et al.

[11] Patent Number: 5,929,973
[45] Date of Patent: Jul. 27, 1999

[54] APPARATUS AND METHOD FOR SIMULTANEOUSLY TRANSFERRING A MASK PATTERN TO BOTH SIDES OF A SUBSTRATE

[75] Inventors: Yukio Kakizaki; Hidetoshi Mori, both of Kanagawa-ken, Japan

[73] Assignee: Nikon Corporation, Tokyo, Japan

[21] Appl. No.: 08/735,082

[22] Filed: Oct. 22, 1996

[30]   Foreign Application Priority Data

Nov. 6, 1995   [JP]   Japan .................................... 7-287659

[51] Int. Cl.$^6$ .................................................. G03B 27/32
[52] U.S. Cl. ................................................. 355/26; 355/53
[58] Field of Search ................................. 355/43–45, 53, 355/77, 78, 79, 89, 132, 24–26, 67

[56]                 References Cited

U.S. PATENT DOCUMENTS

| | | | |
|---|---|---|---|
| 1,478,599 | 12/1923 | Capstaff ..................................... | 255/26 |
| 3,937,579 | 2/1976 | Schmidt ..................................... | 355/132 |
| 4,190,352 | 2/1980 | Bruning ..................................... | 355/26 |
| 4,666,294 | 5/1987 | Gelbert et al. ............................ | 355/89 |
| 4,871,418 | 10/1989 | Wittlinger et al. ..................... | 156/643 |
| 5,122,347 | 6/1992 | Hayden et al. ....................... | 422/186.3 |
| 5,285,236 | 2/1994 | Jain .......................................... | 355/53 |
| 5,604,354 | 2/1997 | Lauverjat ................................. | 355/53 |
| 5,652,645 | 7/1997 | Jain ......................................... | 355/53 |

FOREIGN PATENT DOCUMENTS

| | | | |
|---|---|---|---|
| 1094827 | 11/1994 | China ..................................... | 355/53 |
| 57-58316 | 4/1982 | Japan . | |
| 57-186333 | 11/1982 | Japan . | |

*Primary Examiner*—D. Rutledge
*Attorney, Agent, or Firm*—Armstrong, Westerman, Hattori, McLeland & Naughton

[57]                     ABSTRACT

Disclosed is a double-side exposure apparatus having a substrate holder for holding a photosensitizable substrate; a first exposure system containing a first light source, a first illumination unit for striking a ray of light emitted from the first light source in a first mask, and a first projection optical unit for projecting an image of the first mask onto a front surface of the photosensitizable substrate; and a second exposure system, mounted at the side opposite to the first exposure system, containing a second light source, a second illumination unit for striking a ray of light emitted from the first light source in a second mask, and a second projection optical unit for projecting an image of the second mask onto a back surface of the photosensitizable substrate; wherein the pattern of the first mask is exposed to the front surface of the photosensitizable substrate and the pattern of the second mask is exposed to the back surface thereof substantially simultaneously with exposure of the pattern of the first mask to the front surface thereof. Also, further disclosed is an exposing method for exposure of both surfaces of a substrate with the double-side exposure apparatus having the structure as described above, which involves aligning a first mask for a first exposing surface of a substrate with a second mask for a second exposing surface of the substrate in a state that no the substrate is interposed between a first projection optical unit for projecting a pattern of the first mask to the first exposing surface of the substrate and a second projection optical unit for projecting a pattern of the second mask to the second exposing surface of the substrate.

22 Claims, 10 Drawing Sheets

APPARATUS AND METHOD FOR SIMULTANEOUSLY TRANSFERRING A MASK PATTERN TO BOTH SIDES OF A SUBSTRATE

BACKGROUND OF THE INVENTION

1. Field of The Invention

The present invention relates to an exposure apparatus and, more particularly, to an exposure apparatus for use in a photolithographic process as one step in the manufacture of semiconductor elements, liquid crystal displays, and the like.

2. Description of the Related Art

A photolithographic process for manufacturing semiconductor elements, liquid crystal display elements, thin film magnetic heads, or the like, comprises subjecting a photomask or a pattern formed on a reticle (hereinafter referred to as "mask") to projection-exposure onto a photo-sensitizable substrate, such as a wafer or a glass plate (hereinafter referred to as "substrate"), each with a photosensitizer such as a photoresist, coated thereon.

As an apparatus for conducting such projection-exposure, there has been extensively used an exposure apparatus of a so-called, step-and-repeat exposure system, which comprises exposing a pattern formed on a mask to a given area of a substrate, stepping the substrate by a given distance, re-exposing a pattern formed on the mask, and repeating a series of these steps. As an exposure apparatus of another type, there is known an exposure apparatus of a slit scanning type which comprises exposing a pattern on a mask to a substrate while scanning the mask and the substrate in synchronization relative to a rectangular or arc-shaped illumination area.

In the manufacture of recent semiconductor devices, demands have been made to form a pattern on both front and back surfaces of a substrate while ensuring a high degree of accuracy in relative positions of patterns of both the front and back surfaces thereof, in order to effectively utilize both surfaces. In order to enable the formation of patterns on both surfaces of the substrate, a photo-lithographic process requires exposure of two mask patterns on the front and back surfaces thereof while aligning the mask patterns with each other.

Conventional exposure apparatuses, whether exposure apparatuses of a step-and-repeat system or of a slit scanning type, however, cannot satisfy such demands because they are designed to subject a mask pattern to projection-exposure on only one side of a substrate.

In order to solve problems and difficulties encountered with conventional exposure apparatuses, extensive review and studies have been made to meet the demands for a more sophisticated exposure apparatus and, as a result, an exposure apparatus needs to be developed which can subject a front mask pattern and a back mask pattern to simultaneous projection-exposure onto a front surface and a back surface of a substrate, respectively, while ensuring a high degree of accuracy.

SUMMARY OF THE INVENTION

Therefore, the present invention has as its object the provision of an exposure apparatus adapted to simultaneously subject a front mask pattern for a front surface of a photosensitizable substrate and a back mask pattern for a back surface thereof to projection-exposure onto the front surface of the substrate and the back surface thereof, respectively, while ensuring a high degree of accuracy in relative positions of the patterns for the front and back surfaces thereof.

The present invention has as another object the provision of an exposing method so as to be adapted to the exposure apparatus according to the present invention.

In order to achieve the above object, the present invention provides a double-sided exposure apparatus comprising: a substrate holder for holding a photosensitizable substrate; a first exposure system containing a first light source, a first illumination unit for striking a ray of light emitted from the first light source in a first mask, and a first projection optical unit for projecting an image of the first mask onto a front surface of the photosensitizable substrate; and a second exposure system, mounted on the side opposite to the first exposure system, containing a second light source, a second illumination unit for striking a ray of light emitted from the second light source in a second mask, and a second projection optical unit for projecting an image of the second mask onto a back surface of the photosensitizable substrate; wherein the pattern of the first mask is exposed to the front surface of the photosensitizable substrate and the pattern of the second mask is exposed to the back surface thereof substantially simultaneously with exposure of the pattern of the first mask to the front surface thereof.

With the arrangement as described above, the double-sided exposure apparatus according to the present invention enables scanning exposure by fixing the first and second light sources and the first and second projection optical units to a first support member, fixing the substrate holder and the first and second masks to a second support member, and disposing the first support member and the second support member so as to be moveable in a manner relative to each other.

As first and second projection optical units, there may be employed one in which a pattern of a mask has the same relationship with its projection image. The first and second projection optical units may be of an erect real image type or an inverted real image type. Further, they may both be of a single optical system or of a multiple projection optical system projecting a pattern of a mask in a divided manner. When each of the first and second projection optical units consists of a multiple projection optical system, an area to be exposed to light can be widened.

The multiple projection optical system may be, for example, a projection optical type in which plural projection optical systems are disposed left and right alternately on both sides along a direction crossing a direction in which the first and second support members move relative to each other and plural images projected from the plural projection optical unit are arranged in such a manner that positions of adjacent images overlap partially with each other in the direction crossing the direction of a relative movement of the first and second support members, yet do not overlap with each other in the direction of the relative movement thereof.

A magnification of projection may be of an equal, enlarged or reduced multiplication scale. It should be noted herein that a magnification of projection should be of an equal magnification scale when the first and second projection optical units are of a multiple projection optical system.

The exposure apparatus according to the present invention may be configured in such a fashion that an optical axis of the projection optical unit is disposed horizontally and each of the plane surfaces of the mask and the substrate is disposed vertically or that an optical axis of the projection optical unit is disposed vertically and each of the plane surfaces of the mask and the substrate is disposed horizontally.

In exposing both sides of the substrate by the double-sided exposure apparatus according to the present invention, it is preferred that the first and second masks are aligned with each other in a state in which the photosensitizable substrate is not yet interposed between the first and second projection optical units.

In order to achieve the other object as described above, the present invention further provides an exposing method in which a first mask for a first exposing surface of a photosensitizable substrate is aligned with a second mask for a second exposing surface of said photosensitizable substrate in a state that no said photosensitizable substrate is interposed between a first projection optical unit for projecting a pattern of said first mask to the first exposing surface of said photosensitizable substrate and a second projection optical unit for projecting a pattern of said second mask to the second exposing surface of said photosensitizable substrate.

Other objects, features and advantages of the present invention will become apparent in the course of description that follows, with reference to the accompanying drawings.

BRIEF DESCRIPTION OF THE DRAWINGS

FIG. 6($a$) and FIG. 6($b$) are an explanatory views showing a structure of a mounting window with a mask mounted thereon. FIG. 6($a$) is a partially sectional side view showing the mounting window W1 with the mask mounted thereon and FIG. 6($b$) is a schematic front view showing a mask holder.

FIG. 7($a$) and FIG. 7($b$) are an explanatory view showing an example of a substrate holder. FIG. 7($a$) is a front view showing the substrate holder and FIG. 7($b$) is a side view in section showing the substrate holder as taken along A—A of FIG. 7($a$) line.

DESCRIPTION OF THE PREFERRED EMBODIMENTS

The present invention will be described in more detail with reference to the accompanying drawings.

Figure 1:
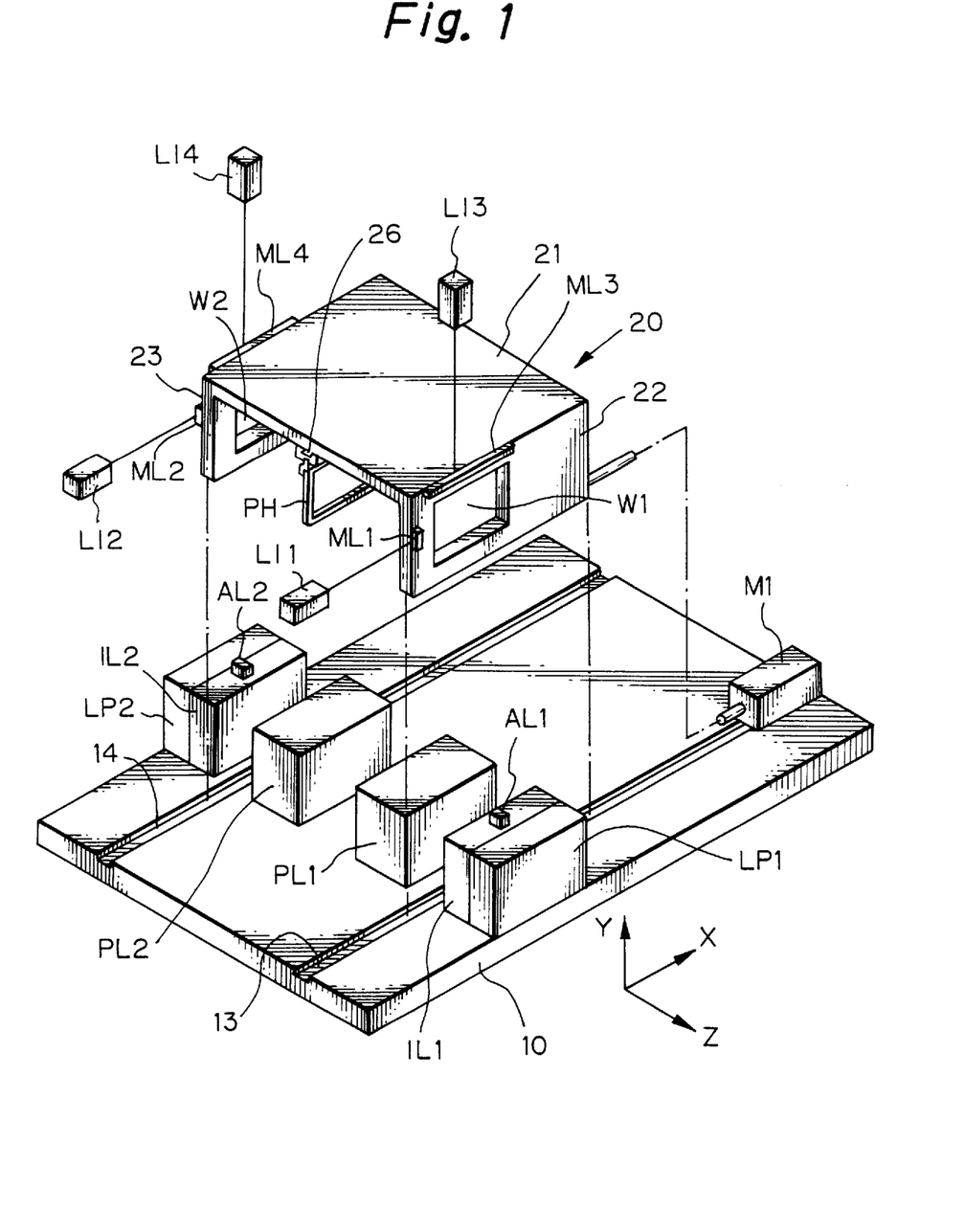
FIG. 1 is a schematic perspective view showing an essential part of an exposure apparatus according to an embodiment of the present invention.
Figure 2:
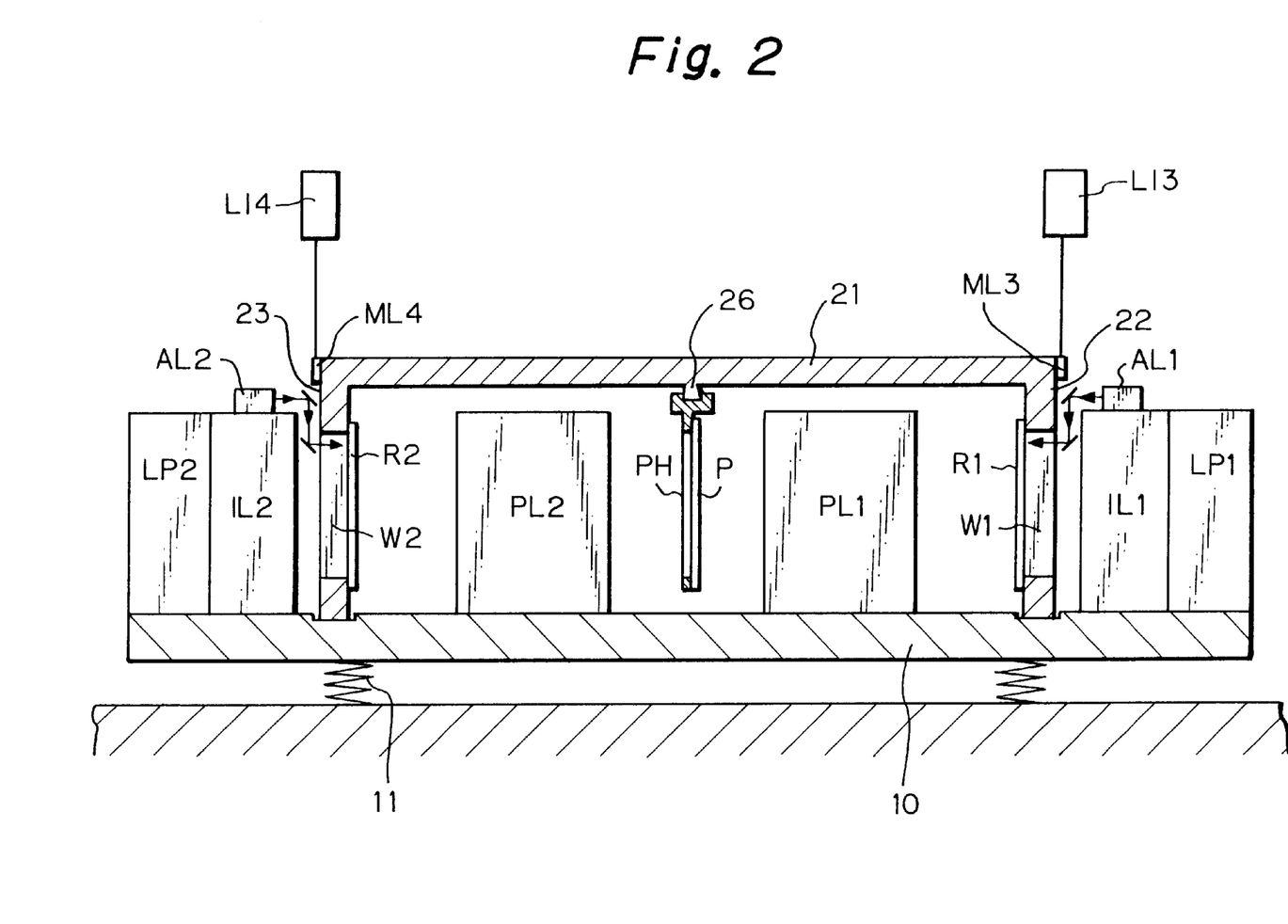
FIG. 2 is a schematic view in section showing the essential part of the exposure apparatus according to the embodiment of the present invention.

Description will first be made of the essential part of the exposure apparatus according to the present invention with reference to FIGS. 1 and 2, in which FIG. 1 is a schematic perspective view showing the essential part thereof and FIG. 2 is a sectional schematic view showing the essential part thereof.

As shown in FIGS. 1 and 2, the exposure apparatus according to the present invention comprises a fixed support member 10 disposed on a floor surface through a vibration proofing pad 11 and a mobile support member 20 disposed so as to be moveable on the fixed support member 10. On the fixed support member 10 are disposed a first light source LP1, a first illumination unit IL1, and a first projection optical unit PL1, which in turn are arranged in symmetry with a second light source LP2, a second illumination unit IL2, and a second projection optical unit PL2, respectively, with respect to a center line of the fixed support member 10 so as to have their optical axes coincide with each other in a z-axial direction as shown in FIG. 1. A guide groove 13 is disposed on an upper surface of the fixed support member 10, extending in a direction perpendicular to the optical axes and parallel to the center line thereof between the first illumination unit IL1 and the first projection optical unit PL1 and, likewise, a guide groove 14 is disposed on an upper surface of the fixed support member 10, extending in a direction perpendicular to the optical axes and parallel to the center line thereof between the second illumination unit IL2 and the second projection optical unit PL2.

The mobile support member 20 may be of a shape having a top wall 21 and two side walls 22 and 23 integral with both sides of the top wall 21, respectively, disposed with its open portion directed toward the bottom. In the side walls 22 and 23 are provided open mounting windows W1 and W2, respectively, for mounting masks thereon. At a central portion of a rear surface of the top wall 21 is mounted a guide 26 for evacuating a substrate, extending in a direction parallel to the side walls 22 and 23. On the guide 26 is mounted a substrate holder PH so as to be slidably movable along it. The mobile support member 20 is disposed so as to allow the bottom surfaces of its side walls 22 and 23 to slide and move with a drive unit M1 in and along the respective guide grooves 13 and 14 on the fixed support member 10 in an X-axial direction, as shown in FIG. 1.

To the side wall 22 of the mobile support member 20 are attached movable mirrors ML1 and ML3 as well as movable mirrors ML2 and ML4 attached to the side wall 23, in a manner that the movable mirrors ML1 and ML3 synchronize with the movable mirrors ML2 and ML4, respectively. The movable mirrors ML1 and ML2 may be each of a corner cube. Laser interferometers LI1, LI2, LI3 and LI4 are disposed respectively facing the movable mirrors ML1, ML2, ML3 and ML4. The laser interferometers LI1 and LI2 each detects an amount of an x-directional movement of the mobile support member 20 and the laser interferometers LI3 and LI4 each detects an amount of deviation of the mobile support member 20 in a y-axial direction from the x-directional movement thereof.

On the fixed support member 10 are disposed first and second alignment optical units AL1 and AL2, each for aligning a first mask R1 with a second mask R2 or for further aligning the first and second masks R1 and R2 with a substrate P. The first and second alignment optical units AL1 and AL2 may be disposed on the mobile support member 20.

As specifically shown in FIG. 2, the masks R1 and R2 are fixed respectively to the mask mounting windows W1 and W2 and a photosensitizable substrate P with its front and back surfaces coated with a photoresist layer is fixed to the substrate holder PH which in turn is mounted on the guide 26 so as to be slidable in the x-axial direction. With this arrangement, the substrate P can be evacuated from the optical axes of the projection optical unit, alignment optical unit and illumination unit by transferring the substrate holder PH in the x-axial direction, when the mask R1 is to be aligned with the mask R2. On the other hand, the substrate P can be returned to a start position for starting an exposing operation immediately before the start of the exposing operation or at the time of alignment of the masks R1 and R2 with the substrate P, prior to the start of the exposing operation, for exposing a second layer or a subsequent layer coated on the second layer. The light stricken from the first illumination unit IL1 illuminates the first mask R1, thereby projecting a pattern of the first mask R1 onto a front surface of the substrate P by the first projection optical unit PL1 (a first exposure system). Further, the light stricken from the second illumination unit IL2 illuminates the second mask R2, thereby projecting a pattern of the second mask R2 onto a back surface of the substrate P by the second projection optical unit PL2 (a second exposure system).

In this example, as each of the first projection optical unit PL1 and the second projection optical unit PL2, there is employed an erected real image optical system having an equal magnification in a manner as will be described in detail hereinafter. After the masks R1 and R2 have been aligned with the substrate P, the mobile support member 20 with the masks R1, R2 and the substrate P fixed thereon is transferred on and along the fixed support member 10 with the first and second light sources LP1 and LP2, the first and second illumination units IL1 and IL2, as well as the first and second projection optical units PL1 and PL2 fixed thereon, respectively, while scanning, thereby allowing the masks R1 and R2 to be simultaneously exposed to the front and back surfaces of the substrate P.

Now, description will be made of the first illumination unit IL1 and the first projection optical unit PL1 for exposing a pattern of the mask R1 onto the front surface of the substrate P. It is to be noted herein that, since the second illumination unit IL2 and the second projection optical unit PL2 for exposing a pattern of the mask R2 onto the back surface of the substrate P have substantially the same configurations and functions as the first illumination unit IL1 and the first projection optical unit PL1, a duplicate description of the second illumination unit IL2 and the second projection optical unit PL2 will be omitted from this specification for brevity of explanation, unless otherwise stated.

Figure 3:
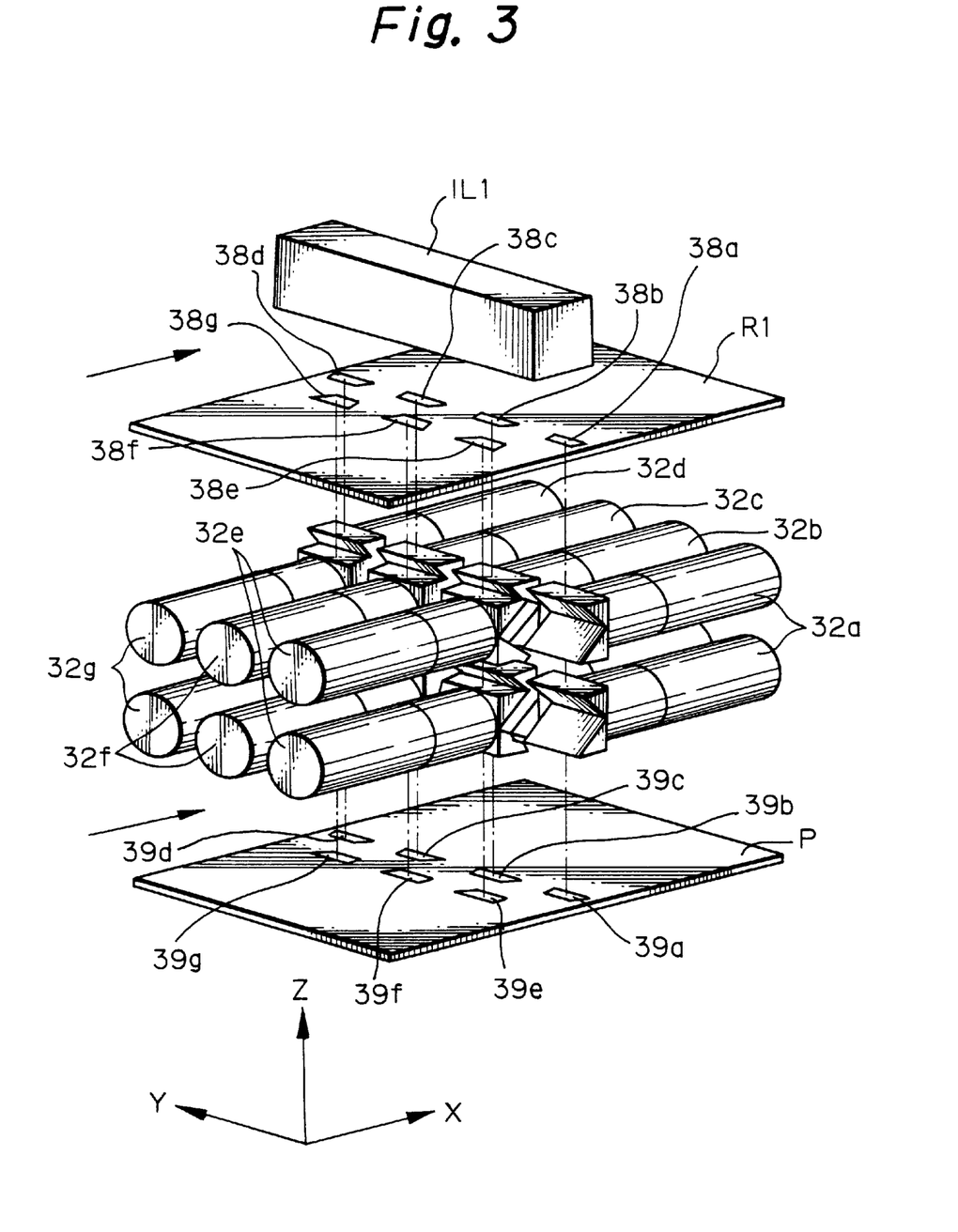
FIG. 3 is a perspective view showing an example of a projection optical unit of the exposure apparatus.

For the first projection optical unit PL1, there is employed an erected real image optical system having an equal magnification. In this example, in order to allow the projection optical unit to deal with a large shot area, as the first projection optical unit PL1, there is employed an erected real image optical system consisting of a plurality of projection optical system sections 32a to 32g, as shown in FIG. 3 (as disclosed in Japanese Patent Unexamined Publication (Kokai) No. 7-57986). In FIG. 3, the coordinates comprise an x-axis as the direction in which the fixed support member 10 moves, a y-axis as the direction perpendicular to the x-axis on the plane of the mask R1, and a z-axis as the direction normal to the mask R1.

The rays of light from the first illumination unit IL1 are arranged so as to illuminate the mask R1 in a uniform fashion. The first illumination unit IL1 leads the rays of light from the light source LP1, such as a silver lamp, or the like, converged by an elliptical mirror, by a light guide with optical fibers bundled randomly, thereby forming a plurality of secondary light source surfaces, each having a uniform light intensity distribution. The secondary light source surfaces allow the rays of light to leave each through a field diaphragm having a rectangular opening portion, thereby enabling the formation of an illumination area on the mask R1 as an image of the opening portion of the field diaphragm. Alternatively, they can be disposed so as to form one illumination area in a rectangular shape extending in the Y-axial direction by using a light source in a rod shape extending in the Y-axial direction.

Figure 4:
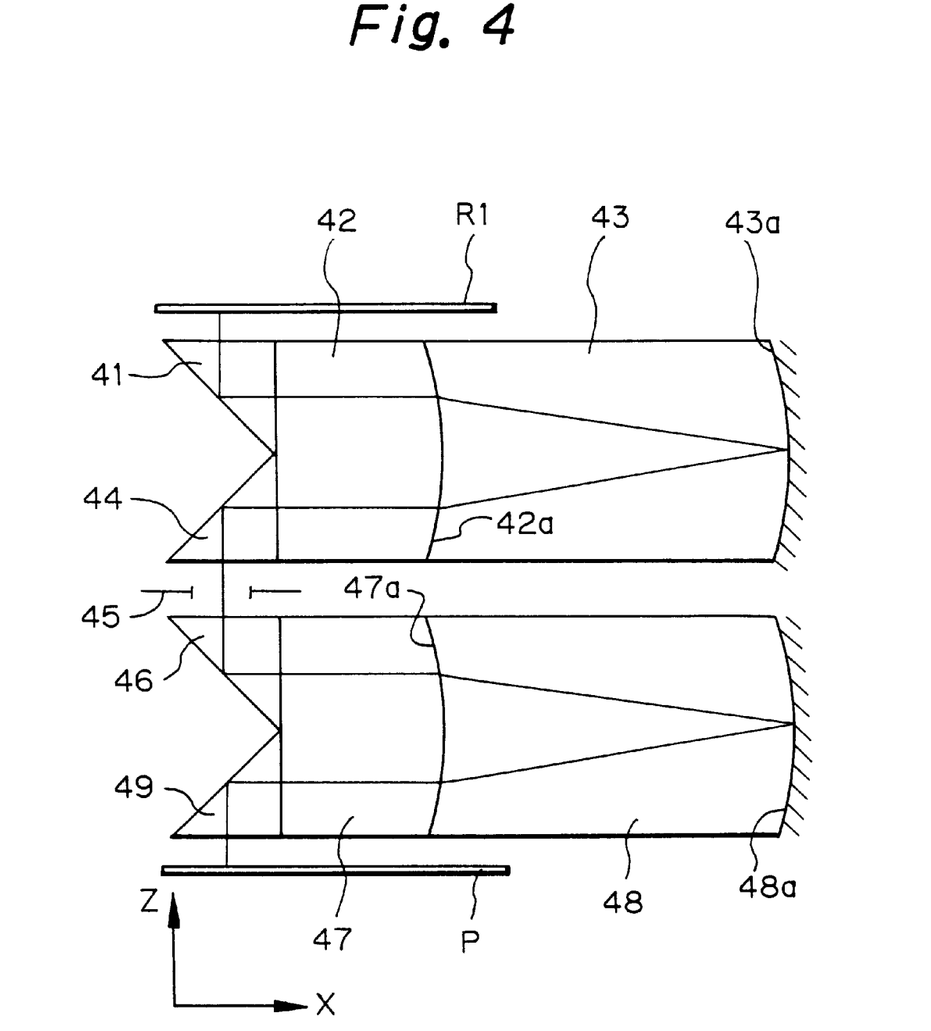
FIG. 4 is a schematic view showing a passage of rays of light through lenses of the projection optical unit of FIG. 3.

FIG. 4 shows the lens configuration of the projection optical system section 32a. As all the other projection optical system sections 32b to 32g have each the same configuration as the projection optical system section 32a, a duplicate description thereof will be omitted herefrom for brevity of explanation.

The projection optical system section 32a consists of a combination of two sets of Dyson type optical systems, comprising a first assembly of partial optical system components 41 to 44, a field diaphragm 45, and a second assembly of partial optical system components 46 to 49. The first partial optical system components assembly comprises a rectangular prism 41 (i.e., a prism having a rectangular reflecting surface) and having a reflecting plane disposed at 45° relative to the mask R1, a flat-convex lens component 42 having an optical axis parallel to an in-plane direction of the mask R1 and having its convex plane directed to the reflecting plane of the rectangular prism 41, a lens component 43 being of a meniscus shape as a whole and having a reflecting plane with its concave plane directed to the flat-convex lens component 42, and a similarly formed rectangular prism 44 having a reflecting plane disposed at a right angle relative to the reflecting plane of the rectangular prism 41 and at 45° relative to the plane of the mask R1.

The rays of light emitting from the first illumination unit IL1 through the mask R1 have a light path deflected at 90° by the rectangular prism 41, thereby allowing it to strike the fat-convex lens component 42 connected to the rectangular prism 41. To the lens component 42 is connected the lens component 43 made of a glass material different from the lens component 42, thereby allowing the rays of light from the rectangular prism 41 to be refracted at a connection plane 42a of the lens component 42 between the lens components 42 and 43 and then reaching a reflecting plane 43a of the lens component 43 with a reflecting membrane deposited thereon by evaporation. The rays of light reflected at the reflecting plane 43a are then refracted at the connection plane 42a, followed by reaching the rectangular prism 44 joined to the lens component 42. The rays of light passing through the lens component 42 have the light path deflected at 90° by the rectangular prism 44 and forms a primary image of the mask R1 on the outgoing side of the rectangular prism 44. As a result, it can be noted herein that the primary image of the mask R1 formed by the first assembly consisting of the partial optical system components 41 to 44, inclusive, is an equally magnified image having a positive lateral magnification in the x-axial direction and a negative lateral magnification in the y-axial direction.

The rays of light passed through the primary image are travelling through the second assembly of the partial optical system components 46 to 49, inclusive, to the surface of the substrate P on which a secondary image of the mask R1 is formed. It can be noted herein that, as the second assembly of the partial optical system components 46 to 49 has the same structure as the first assembly of the partial optical system components 41 to 44, respectively, a specific description of the second assembly will be omitted herefrom for brevity of explanation. Like the first assembly of the partial optical system components, the second assembly of the partial optical system components 46 to 49 forms an equally magnified image having a positive lateral magnification in the x-axial direction and a negative lateral magnification in the y-axial direction. Thus, the secondary image formed on the plane of the substrate P is an erected image of the mask R1 having an equal magnification, namely, an image having a positive lateral magnification in each of the vertical and horizontal directions. The projection optical system section 32a in the first and second assemblies of the partial optical system components is of an double telocentric optical unit. The first and second assemblies of the partial optical system components may be composed in such a manner that air is filled between the lens component 42 and the reflecting plane 43a and between the lens component 47 and the reflecting plane 48a, respectively. In the position of the primary image formed by the first assembly of the partial optical system components is disposed the field diaphragm 45.

The field diaphragm 45 has an opening, for example, of a four-sided shape in section with one pair of the opposite sides parallel and the other pair not parallel (hereinafter referred to as trapezoid or related words), thereby allowing the field diaphragm 45 to define a shot area on the substrate P in a trapezoidal shape. In other words, the projection optical system sections 32a to 32g has field areas 38a to 38g, respectively, defined by the field diaphragm disposed in the projection optical unit. An image in each of these field areas 38a to 38g is formed as an erected image having an equal magnification in each of the shot areas 39a to 39g, respectively, on the substrate P. It is to be noted herein that the projection optical system sections 32a to 32d are disposed so as to allow the field areas 38a to 38d, respectively, to be oriented in the y-axial direction as shown in the drawing and 32e to 32g are also disposed so as to allow the field areas 38e to 38g, respectively, to be oriented in the y-axial direction as shown in the drawing yet different from the field areas 38a to 38d in the x-axial direction. Further, the projection optical system sections 32a to 32d and 32e to 32g are disposed so as to allow their respectively rectangular prisms to be located in positions extremely close to each other.

On the substrate P, the projection optical system sections 32a to 32d are arranged so as to form shot areas 39a to 39d oriented respectively along and in the y-axial direction as shown in the drawing, while the projection optical system sections 32e to 32g are also arranged so as to form shot areas 39e to 39g oriented respectively along and in the y-axial direction as shown in the drawing yet at positions different from the positions where the shot areas 39a to 39d are formed. The shot areas 39a to 39g are erected images having a magnification equal to the field areas 38a to 38g, respectively.

Figure 5:
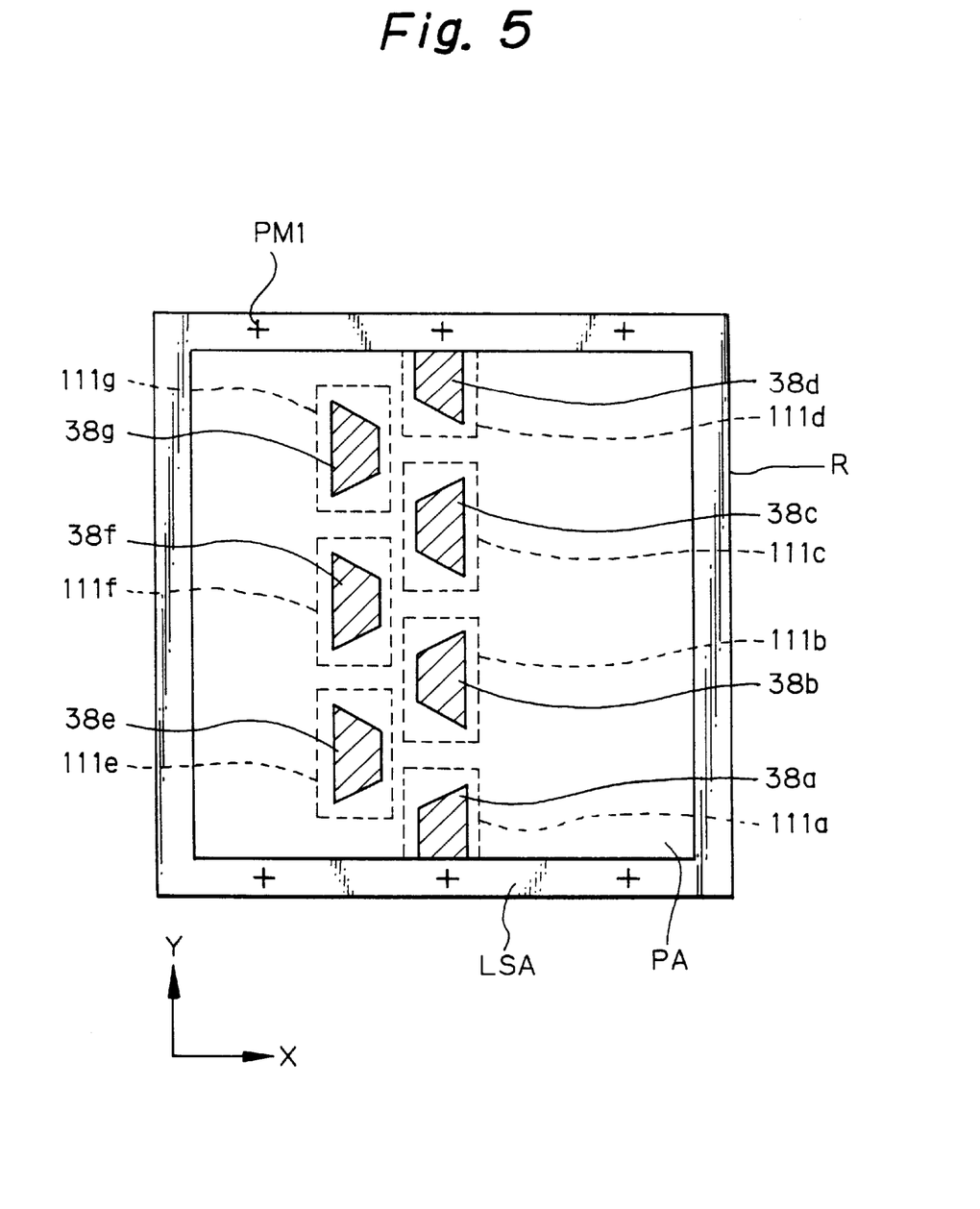
FIG. 5 is a schematic view showing a horizontally spatial relationship between visual field areas and masks by the projection optical unit.

FIG. 5 shows the plane relationship of the positions of the field areas 38a to 38g formed by the respective projection optical system sections 32a to 32g with the mask R1. On the mask R1 is formed a pattern PA and a light shade area LSA is provided so as to enclose the area of the pattern PA. The light shade area LSA is provided with plural alignment marks PM1 for use in alignment. The first illumination unit IL1 is disposed so as to uniformly illuminate the illumination areas 111a to 111g enclosed by broken lines in the drawing. In the illumination areas 111a to 111g are positioned the trapezoidal field areas 38a to 38g, respectively, formed each by the field diaphragm 45 disposed in the projection optical unit. Further, the top side of the trapezoidal shape (the shorter side of the two parallel sides of the trapezoidal shape) of each of the field areas 38a to 38d is disposed facing the top side of the trapezoidal shape of each of the field areas 38e to 38g. In this instance, the trapezoidal-shaped field areas 38a to 38g, or the shot areas 39a to 39g, are disposed so as for the sum of their widths extending in the x-axial direction, that is, along the direction in which the mobile support member 20 travels, to become always constant at any position in the y-axial direction. This arrangement is made in order to allow rays of light to be exposed in a uniform amount over the entire region of the shot areas on the substrate P, when the large shot area of the substrate P is exposed while the mobile support member 20 is running in the x-axial direction. The shape of the shot area, that is, the shape of the opening of the field diaphragm 45, that can provide a uniform distribution of the amount of the rays of light exposed, is not restricted to the trapezoidal shape. For example, the opening of the field diaphragm 45 may be of a hexagonal shape. In this instance, too, the sum of the widths of the shot areas 39a to 39g extending in the x-axial direction can be made always constant at any position in the y-axial direction, thereby enabling a uniform distribution of the amount of the rays of light over the entire shot areas on the substrate P.

In order to more specifically describe the fact that the sum of the x-directional widths of shot areas 39a to 39g is set so as to become always constant at any position in the y-axial direction, a description will be made of the positional relationship of the field areas 38a to 38g, respectively, with reference to FIG. 5. It is noted herein that, as the relationship of all the field areas is the same, description will be made taking the field areas 38a and 38e as an example. As shown in FIG. 5, the field area 38a is arranged so as to be located diagonally facing the field area 38e with their top parallel sides facing each other diagonally. Further, the field area 38a and the field area 38e are disposed in such a manner that, for example, if the field area 38a would be transferred to abut with the field area 38e to the left in the x-axial direction, they can be combined into a parallelogram with the lower oblique side of the field area 38e coinciding thoroughly with the upper oblique side of the field area 38a and with the shorter parallel side of the field area 38e combined with the longer parallel side of the field area 38a extending straight vertically and the longer parallel side of the former combined with the shorter parallel side of the latter extending straight vertically, when seen in the drawing. In other words, the field areas 38a and 38e are arranged such that the x-directional width of them is set so as to become always constant when taken at any position in the y-direction in which they are located, namely, to become always equal to the x-directional width of each of the field areas. Therefore, the sum of the x-directional widths of the shot areas 39a to 39e can also be set so as to become always constant when taken at any position in the y-direction in which they are located.

Figure 6A:
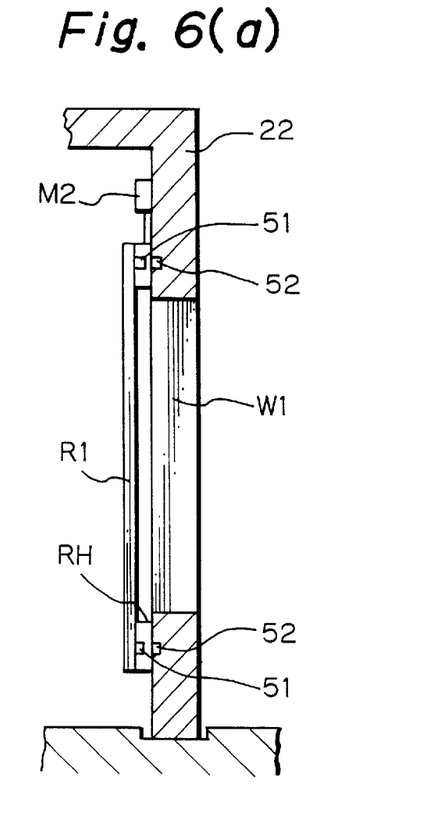
Figure 6B:
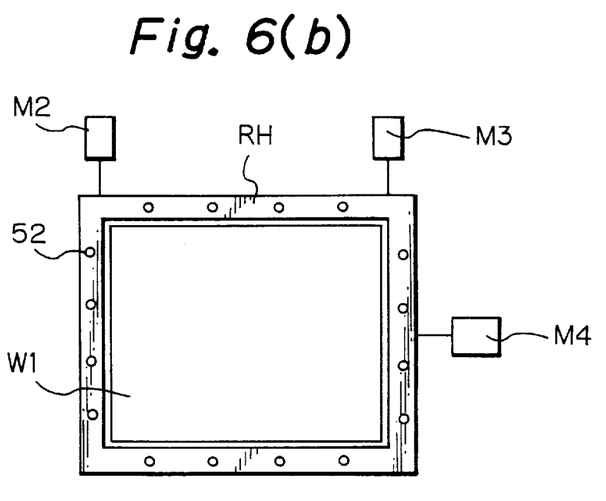

Turning now to FIG. 6, description will be made of the structure of the mounting of the mask to the mounting window. FIG. 6(a) is a partial sectional view showing the mounting window W1 with the mask mounted thereon and FIG. 6(b) is a schematic view showing the mask holder. The mounting window W1 of the side wall 21 will be described herein and a description will be omitted of a mounting wall W2 of the other side wall 22 on which a mask R2 is mounted, because the mounting of the mask R2 on the mounting wall W2 can be made in the same manner as that of the mask R1.

To an edge portion of the mounting window W1 is fixed a mask holder RH of a rectangular frame shape so as to enclose the mounting window W1. To the mask holder RH is in turn fixed the mask R1 with a pattern formed so as to be projected onto the substrate P. The mask R1 can be fixed to the mask holder RH by causing a peripheral edge portion of the mask R1 to be attached by vacuum pressure to the mask holder RH by connection of the suction holes 51 with an exhaust unit (not shown). Likewise, the mask holder RH can be fixed to the mounting window W1 of the mobile support member 20 by causing the mask holder RH to be attached by vacuum pressure to the side wall 22 of the mobile support member 20 by connection of the suction holes 52 provided in the side wall 22 thereof with the exhaust unit. The mask holder RH can be disposed so as to be movable in a parallel direction with respect to the side wall 22 or to be pivotally movable by with the drive units M2 to M4 disposed in the side wall 22 and the position in which the mask holder RH is fixed to the side wall 22 can thereby be adjusted.

Figure 7A:
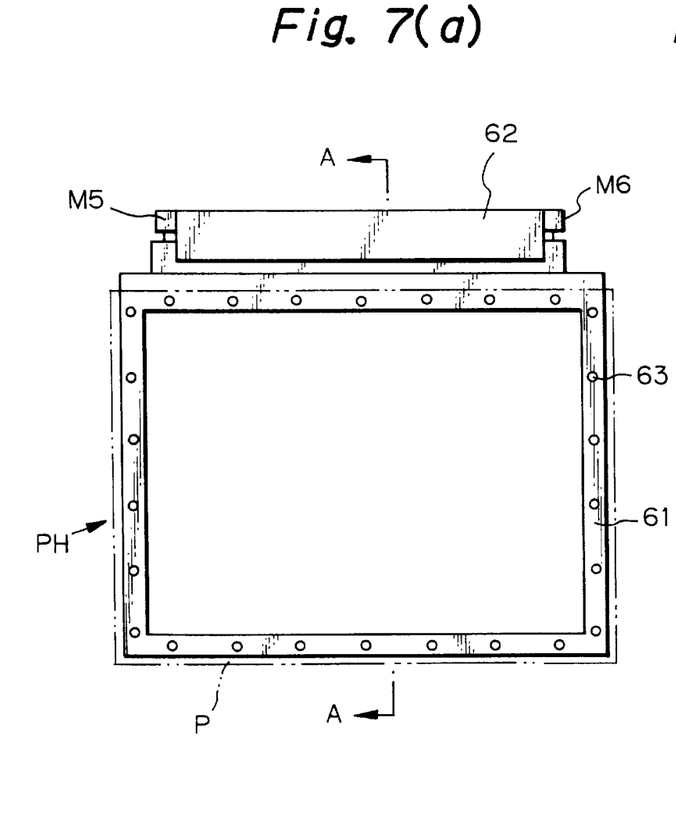
Figure 7B:
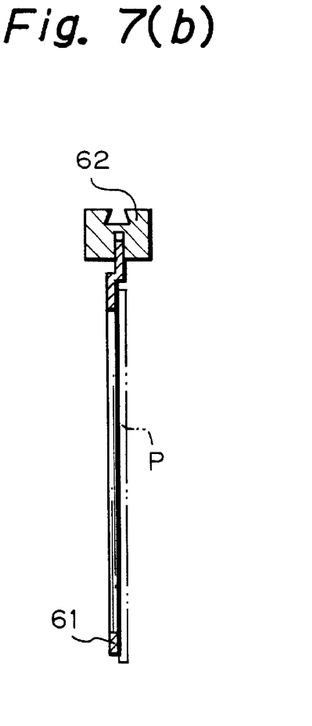

Now, a description will be made of the details of the substrate holder with reference to FIG. 7. The substrate holder PH as shown in FIG. 7 is so adapted as to be suitable for holding the rectangular-shaped substrate. In order to enable the both sides of the substrate P to be exposed at the same time, it is preferred that the substrate P takes the structure in which it is supported at its outer peripheral portion and it incurs substantially no transformation by its own weight.

The substrate holder PH comprises an attachment frame portion 61 of a rectangular shape having substantially the same outer shape as the substrate P and a sliding portion 62 disposed so as to be engaged slidably with the guide 26 of the mobile support member 20 for evacuating the substrate, as needed. The attachment frame portion 61 is provided with a plurality of suction holes 63 connected to an exhaust means (not shown), thereby allowing the substrate P to be attached by vacuum pressures to the attachment frame portion 61 by placing the edge portion of the substrate P on the attachment frame portion 61 and discharging the air through the suction holes 63. The attachment frame portion 61 is further disposed so as to be movable with respect to the sliding portion 62 and the posture of the substrate P can be adjusted by operating the drive units MS and M6 fixed to the sliding portion 62.

Figure 8:
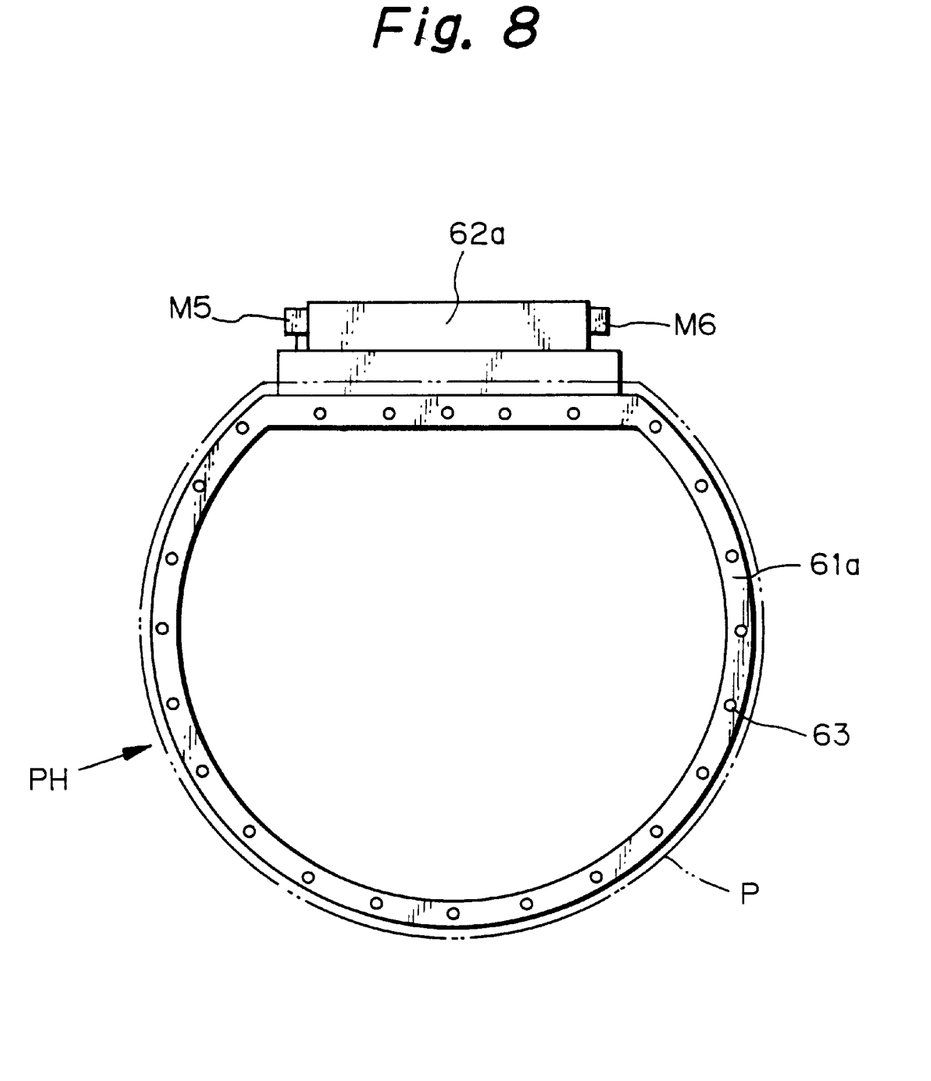
FIG. 8 is an explanatory view showing another example of a substrate holder.

The substrate P may alternatively be of a semicircular shape as shown in FIG. 8, wherein a ring-shaped attachment frame portion 61a and a sliding portion 62a are provided. In this case too, the ring-shaped attachment frame portion 61a is provided at its chord and arc sections with suction holes 63 through which air is sucked to thereby allow the substrate P to be attached by vacuum pressure to the substrate holder PH. Further, it can be adjusted to the sliding portion 62a by the drive units M5 and M6.

Figure 9:
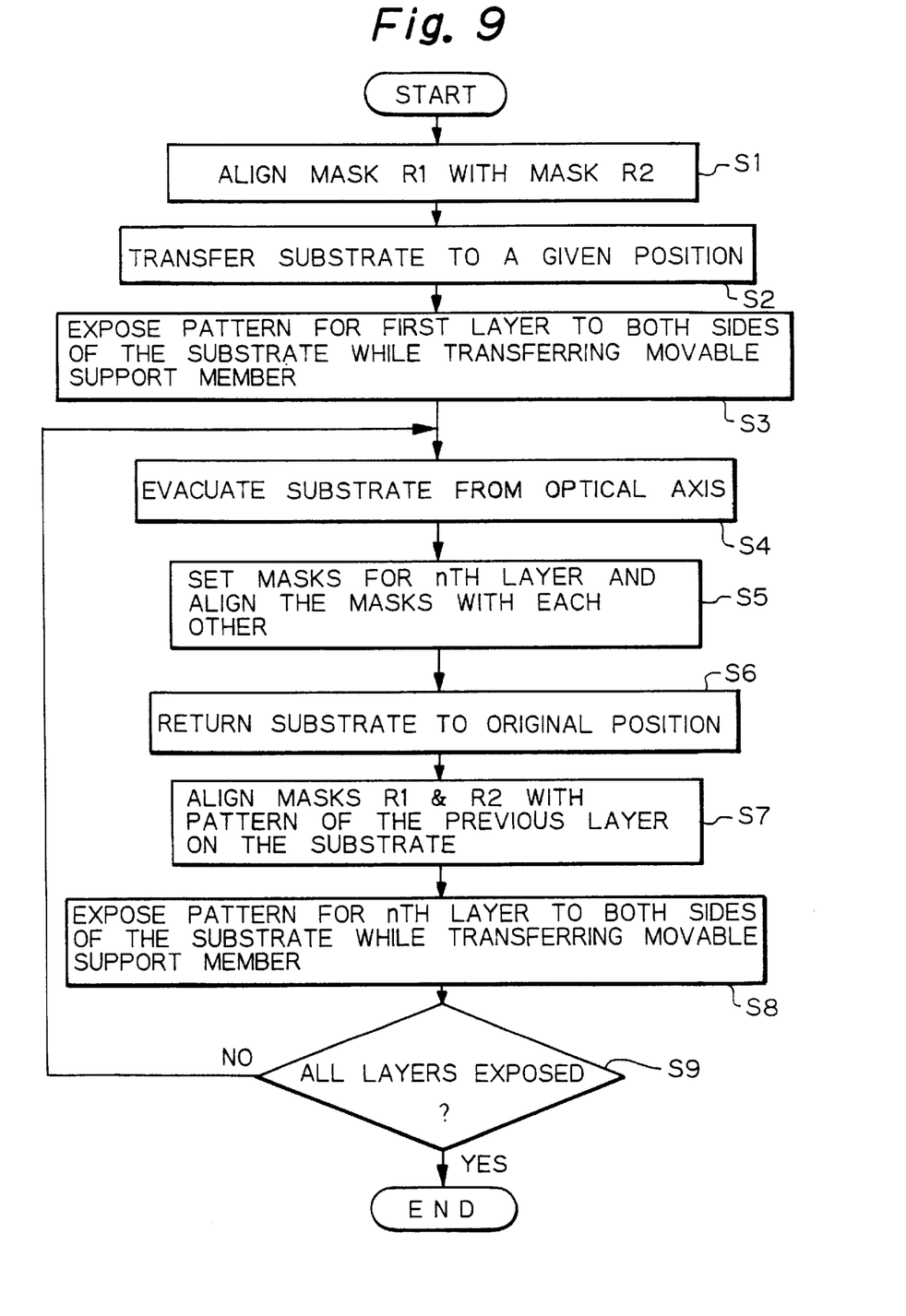
FIG. 9 is a flowchart showing processes of exposing operations.

Turning now to the flowchart as shown in FIG. 9, a description is made of the exposing process for exposing a pattern of a mask to a photosensitizable substrate by the exposure apparatus according to the present invention.

First, the mask R1 for use in exposing its pattern to the front surface of the substrate, hereinafter referred to as front surface exposure, is mounted on the mounting window W1 of the mobile support member 20 and the mask R2 for use in exposing its pattern on the back surface of the substrate, hereinafter referred to as back surface exposure, is mounted on the mounting window W2 of the mobile support member 20, followed by alignment of the mask R1 with the mask R2 or vice versa (step S1). The alignment of the masks is made by observing the extent to which the alignment mark RM1 of the front mask R1 overlaps with the alignment mark RM2 of the back mask R2 by the alignment optical units AL1 and AL2 through the first and second projection optical units PL1 and PL2, respectively, in such a state that the substrate is not yet held by the substrate holder PH.

Each of the alignment optical units is provided at its detection section with an image pick-up unit which is disposed so as to pick up the images of the two alignment marks RM1 and RM2. The images are then subjected to image processing and a correction value of accuracy in relative positions between the front and back masks R1 and R2 is given from a deviation of the position of the alignment mark RM1 from the position of the alignment mark RM2. The alignment may be made on the basis of the given correction value and the relative positions of the masks R1 and R2 can be adjusted by driving the drive units M2 through M4 and transferring the mask holder RH with the masks fixed thereto toward a desired direction.

Figure 10:
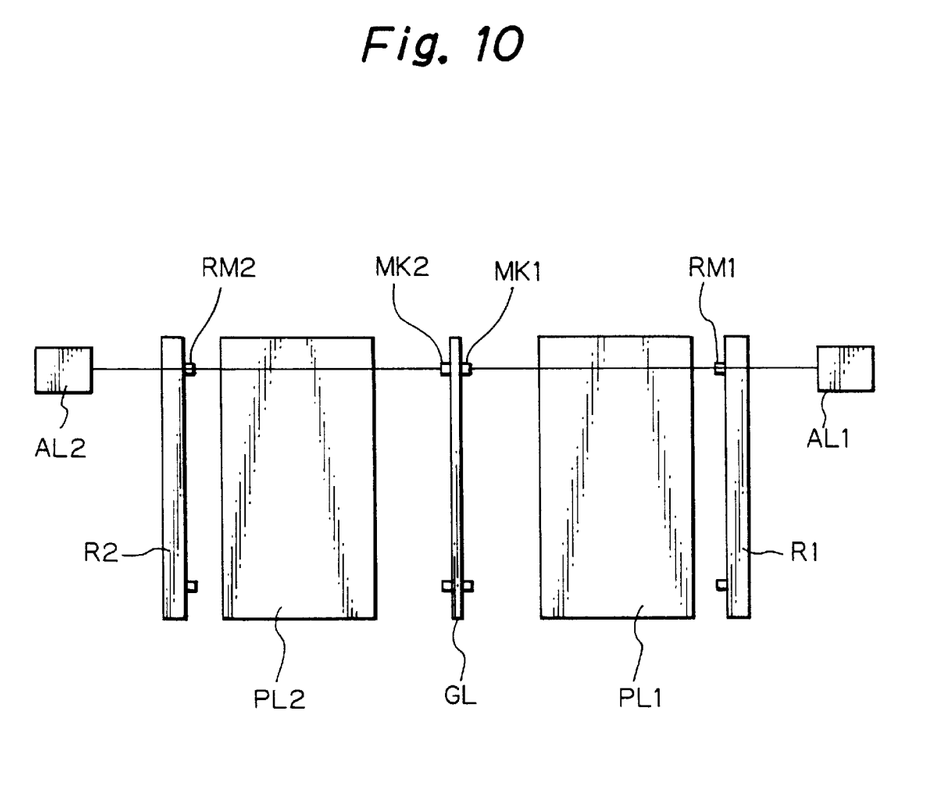
FIG. 10 is an explanatory view showing alignment of masks with respect to each other.

An alternative process for aligning the mask R1 with the mask R2 will be described hereinafter with reference to FIG. 10. For this alignment process, there may be used a colorless transparent glass plate GL on which marks MK1 and MK2 are provided at its front and back surfaces corresponding to the alignment marks RM1 and RM2 of the respective masks R1 and R2. The thickness of the glass plate GL is set to be equal to that of the substrate P. The front surface of the glass plate GL with the mark MK1 formed for the first projection optical unit PL1 is arranged so as to cooperate with the surface of the mask R1 on which the corresponding pattern is formed, while the back surface of the glass plate GL with the mark MK2 formed for the second projection optical unit PL2 is likewise arranged so as to cooperate with the surface of the mask R2 on which the corresponding pattern is formed.

The glass plate GL is held with the substrate holder PH in place of the substrate and interposed between the projection optical units PL1 and PL2. The mask R1 can be aligned with the glass plate GL by adjusting the position of the alignment mark RM1 of the mask R1 by the aid of the alignment optical unit AL1 so as to come into coincidence with the mark MK1 of the glass plate GL. Likewise, the mask R2 can be aligned with the glass plate GL by adjusting the position of the alignment mark RM2 of the mask R2 by the aid of the alignment optical unit AL2 so as to come into coincidence with the mark MK2 of the glass plate GL. The positions of the masks R1 and R2 may be adjusted by driving the drive units M2 through M4 and moving the mask holder RH in a given direction.

When there is employed the alignment optical unit of a single system as consisting of one single unit or a pair of units, a plurality of alignment marks are observed one after another to thereby adjust their relative positions so as to bring the masks R1 and R2 into the most possible accurate alignment with each other. On the other hand, when there is employed the alignment optical unit of a plural system as consisting of two or more single units or two or more pairs thereof, it is preferred to arrange the alignment optical unit in a manner so as to observe the alignment marks at a simultaneous time. This arrangement of the alignment optical unit can do without the step for observing the alignment marks one after another. It can be noted herein that the processes for determining the correction value for accuracy in the relative positions of the front and back masks have been described hereinabove by subjecting the results obtained by observation with the alignment optical unit to image processing. It is also possible to adopt other processes such as a laser step alignment (LSA) for scanning the marks with respect to laser spot light in a slit form and photoelectrically detecting the diffracted or scattered rays of light emitting from the marks. When the alignment marks RM1 and RM2 are set to a pattern within the shot area, the alignment optical units AL1 and AL2 are evacuated to the positions in which they do not interfere with exposure, when the main exposure is conducted.

After the alignment of the mask R1 for exposing the front surface of the substrate with the mask R2 for exposing the back surface thereof has been completed, they are fixed to the mobile support member 20 in this state. The masks R1 and R2 can be mechanically fixed to the mobile support member 20 by means of attachment by vacuum pressure or other means. It is also possible to fix the masks R1 and R2 in such a manner that the mask R2 is fixed to the mobile support member 20 by means of attachment by vacuum pressure and the mask R1 is brought into a state in which its position can be adjusted by the drive units M2 through M4 and the mask R1 is transferred by driving the drive units M2 through M4 so as to cause the position of the mask R1 to fail to be deviated from the position of the mask R2 during exposure operations, while monitoring the position of the mask R1 relative to the position of the mask R2 by the laser interferometers LI1 through LI4 during a movement of the movable support member 20.

As the mask R1 for exposing the front surface of the substrate has been aligned with the mask R2 for exposing the back surface thereof, the substrate P held by the substrate holder RH is transferred along the substrate-evacuating guide 26 to a position in which the masks R1 and R2 are lined up (step S2). Then, the mobile support member 20 is transferred so as to allow the masks R1 and R2 and the substrate P to move to a start position for starting the exposing operation located between the first projection optical unit PL1 and the second projection optical unit PL2 and the exposing operation is started from this start position exposing a first photoresist layer on each of the front and back surfaces of the substrate P. The simultaneous exposing operations to the front and back surface of the substrate P can be made by moving the mobile support member 20 at a constant speed by use of the drive unit M1 and scanning the masks R1 and R2 and the substrate P relative to the projection optical units PL1 and PL2 as well as the illumination units IL1 and IL2 acting as a light source for the exposing operations (step S3).

When the substrate is opaque, neither photoresist layer coated on the front surface of the substrate is sensitized with a ray of light for exposing the front surface of the substrate nor photoresist layer coated on the back surface of the substrate is sensitized with the ray of light for exposing the back surface of the substrate, even if the both surfaces of the substrate P are subjected to exposure at the same time. On the other hand, when the substrate is transparent, like a glass plate, rays of light with which one of the surfaces of the substrate is irradiated pass through the transparent substrate and pass out from the opposite surface of the substrate. Accordingly, in usual cases, the rays of light that strike the surface of the substrate sensitize the photoresist layer coated on the surface of thereof and the outgoing rays of light that pass through the substrate sensitize the photoresist layer coated on the opposite surface thereof, too. It is to be noted herein, however, that the rays of light are focused on the photoresist layer coated on the surface of the substrate which they strike, while the rays of light passed through the substrate are defocused on the opposite surface thereof so that they have a low level of optical intensity. Therefore, even if there is used a transparent material for the substrate, it is possible to simultaneously expose both sides of the substrate by appropriately selecting a photoresist material having an appropriate extent of sensitivity to light.

Then, a description will be made of the way in which a pattern is exposed to a second photoresist layer coated on the first photoresist layer formed on the surface of the substrate. The substrate P held by the substrate holder PH is transferred along the substrate-evacuating guide 26 and evacuated from the optical axes of the projection optical units PL1 and PL2 (step S4). Then, a mask R1 for exposing the front surface of the second layer is aligned with a mask R2 for exposing the back surface of the second layer (step S5). In this case, in order to expose patterns to the second layers, it is necessary to align the masks R1 and R2 for the second layers with the patterns formed on the first layers after the mask R1 has been aligned with the mask R2 in the step S5. At this end, the substrate P is returned to its original position along the guide 26 (step S6) and then the mask R1 for exposing the front surface of the second layer and the mask R2 for exposing the back surface thereof are aligned with the alignment marks baked on the first layers on the substrate P at the time of exposing the first layer, while observing the alignment marks with the alignment optical units AL1 and AL2 (step S7).

In other words, in order to expose the patterns to the n-th layer which is coated on the (n-l)th layer, the mask R1 for the front surface of the n-th layer is first aligned with the mask R2 for the back surface of the n-th layer in the same manner as in the step S5 and thereafter the masks aligned masks R1 and R2 are in turn aligned with the patterns formed on the (n−1)th layer in the manner as in the step S7.

The positions of the masks R1 and R2 relative to the substrate P may be adjusted by first fixing the substrate P and then driving the mask holder RH for the masks R1 and R2 in synchronism with the substrate P fixed or by first fixing the masks R1 and R2 in a state that their alignment has been finished and then driving the drive units M5 and M6 mounted on the substrate holder PH to thereby adjust the vertical position or the pivotal position of the substrate P with respect to the masks R1 and R2 fixed.

In this case, if a pattern present in an actual shot area is set as an alignment mark and an alignment mark (a mark for exclusive use as an alignment mark or a real pattern) on the substrate is observed using an actual exposing wavelength with an alignment optical unit, there is the risk that the problem may arise that the alignment marks are caused to be sensitized at the same time. In order to prevent this, the configuration can be arranged in such a way that, for example, the position of an alignment mark on the mask for the front surface is set as a reference and its position relative to the position of a reference pattern on the substrate can be detected by an optical interferometer or the like. This configuration allows omission of the alignment of the reference mask at the time of exposing the second layer or the subsequent layer coated thereon with the substrate prior to the start of the exposing operation.

After the alignment of the masks R1 and R2 for the second layers with the substrate has been completed, the mobile support member 20 is moved to transfer the masks R1 and R2 and the substrate P to the start position in which to start the exposing operation. Thereafter, the mobile support member 20 is moved by the drive unit M1 at a constant speed while scanning the masks R1 and R2 relative to the substrate P, whereby the patterns can be transferred to the second layers so as to be superimposed onto the patterns formed on the first layer (step S8). By repeating the processes in the steps S4 through S8 in substantially the same manner as described hereinabove, patterns can be transferred to the n-th layers formed on the (n−1)th layers (step S9).

The present invention can further provide a double-sided exposure apparatus adapted so as to expose the two surfaces of a substrate simultaneously while sustaining accuracy in relative positions of the patterns on the both surfaces of the substrate, by aligning the masks for the front and back surfaces of the substrate and then aligning the reference mask with a layer on the substrate to be exposed, prior to the main exposing operations.

Furthermore, the present invention can provide an exposing method for exposing both surfaces of a photosensitizable substrate at the same time by means of the exposure apparatus according to the present invention having the structure and configurations as described hereinabove. In this method, a first mask for a first exposing surface of a photosensitizable substrate is aligned with a second mask for a second exposing surface of the substrate in a state that no substrate is interposed between a first projection optical unit for projecting a pattern of the first mask to the first exposing surface of the substrate and a second projection optical unit for projecting a pattern of the second mask to the second exposing surface of the substrate.

With the arrangement in the manner as described hereinabove, the present invention can subject a pattern of a mask for a front surface and a pattern of a mask for a back surface to projection-exposure to the front and back surfaces of a photosensitizable substrate at the same time, while sustaining accuracy in relative positions of the patterns for the front and back surfaces.

What is claimed is:

1. An exposure apparatus comprising:
   a transferring mechanism which transfers a mask and a substrate in synchronization with a plurality of projection optical units, said transferring mechanism comprising a fixed member to support said projection optical units and a movable member, and
   an exposure mechanism which exposes a pattern formed on said mask to both surfaces of said substrate during transferal of said movable member.

2. An exposure apparatus as claimed in claim 1, wherein said mask comprises two sheets.

3. An exposure apparatus as claimed in claim 1, wherein said movable member supports said mask and said substrate.

4. An exposure apparatus as claimed in claim 1, wherein said fixed support member includes a guide portion adapted to guide said movable member in a predetermined direction.

5. An exposure apparatus as claimed in claim 1, wherein said projection optical units are an optical system of Dyson type.

6. An exposure apparatus as claimed in claim 1, wherein said projection optical units are an optical system adapted to form an equally magnified image having a positive lateral magnification.

7. An exposure apparatus as claimed in claim 1, further comprising a detector for detecting a position of said transferring mechanism.

8. An exposure apparatus as claimed in claim 7, wherein said detector comprises a mobile mirror.

9. An exposure apparatus as claimed in claim 8, wherein said mobile mirror is a corner cube.

10. An exposure apparatus as claimed in claim 1, further comprising an anti-vibration member for said exposure apparatus, said anti-vibration member connected to said fixed support member.

11. An exposure apparatus as claimed in claim 1, wherein said transferring mechanism transfers said mask and said substrate in a substantially horizontal direction.

12. An exposing method comprising:
   the step of disposing two sheets of a mask on a first movable member, each of said sheets having a pattern;
   the step of disposing a substrate on a second movable member:
   the step of mounting a projection optical unit on a fixed member having an antivibration member for said projection optical unit, so that said projection optical unit exposes a pattern formed on said mask to said substrate; and
   the step of exposing a pattern formed in said mask to both surfaces of said substrate by transferring said mask and said substrate in synchronization with said projection optical unit.

13. An exposing method as claimed in claim 12, wherein said substrate is interposed between said two sheets of said mask.

14. An exposing method as claimed in claim 12, wherein said two sheets of said mask are held in a direction perpendicular to a direction of light ray emission from said optical unit.

15. An exposing method as claimed in claim 13, wherein said projection optical unit is interposed between said mask and said substrate.

16. An exposing method as claimed in claim 12, wherein said first movable member and said second movable member are integrated into a single body.

17. An apparatus that exposes a pattern formed on a mask to a substrate, comprising:
   a projection optical unit disposed between said mask and said substrate;
   a support member that supports said projection optical unit;
   an anti-vibration member disposed in said support member so as to suppress at least the vibration of said projection optical unit;
   a transferring mechanism adapted to transfer said mask and said substrate with respect to said projection optical unit in synchronism with each other; and
   an exposure mechanism adapted to expose the pattern formed on said mask to both surfaces of said substrate during the movement of said transferring mechanism.

18. An apparatus as claimed in claim 17, wherein said exposure mechanism further comprises an optical system to illuminate said mask.

19. An apparatus as claimed in claim 17, wherein said exposure mechanism further comprises an optical system to illuminate said mask; and
   said anti-vibration member is adapted to suppress the vibration of said optical system.

20. An apparatus as claimed in claim 17, further comprises an alignment mechanism adapted to align said mask with said substrate.

21. An apparatus as claimed in claim 17, wherein said transferring mechanism is adapted to transfer said mask and said substrate in a substantially horizontal direction.

22. An apparatus as claimed in claim 17, wherein said transferring mechanism supports said mask and said substrate integrally.

* * * * *